United States Patent
Strobl

(10) Patent No.: US 9,437,767 B2
(45) Date of Patent: Sep. 6, 2016

(54) MULTIPLE SOLAR CELL AND METHOD FOR MANUFACTURING THE SAME

(71) Applicant: AZUR SPACE Solar Power GmbH, Heilbronn (DE)

(72) Inventor: Gerhard Strobl, Stuttgart (DE)

(73) Assignee: Azur Space Solar Power GmbH, Hailbronn (DE)

( * ) Notice: Subject to any disclaimer, the term of this patent is extended or adjusted under 35 U.S.C. 154(b) by 0 days.

(21) Appl. No.: 14/689,652

(22) Filed: Apr. 17, 2015

(65) Prior Publication Data

US 2015/0325727 A1 Nov. 12, 2015

Related U.S. Application Data

(63) Continuation of application No. 13/366,298, filed on Feb. 4, 2012, now Pat. No. 9,070,810.

(60) Provisional application No. 61/439,449, filed on Feb. 4, 2011.

(51) Int. Cl.
| | |
|---|---|
| *H01L 27/142* | (2014.01) |
| *H01L 31/048* | (2014.01) |
| *H01L 31/0687* | (2012.01) |
| *H01L 31/028* | (2006.01) |
| *H01L 31/0304* | (2006.01) |
| *H01L 31/0216* | (2014.01) |
| *H01L 31/18* | (2006.01) |

(52) U.S. Cl.
CPC ......... *H01L 31/0687* (2013.01); *H01L 31/028* (2013.01); *H01L 31/02167* (2013.01); *H01L 31/0304* (2013.01); *H01L 31/048* (2013.01); *H01L 31/184* (2013.01); *Y02E 10/544* (2013.01)

(58) Field of Classification Search
CPC ..... H01L 31/18; H01L 31/48; H01L 31/504; H01L 31/0687; H01L 31/1876; H01L 31/512; H01L 31/522; H01L 31/525; H01L 21/2532; H01L 21/2381; H01L 21/245; H01L 21/28255; H01L 21/28264; H01L 27/1423
USPC ....... 136/244, 246, 251, 252, 256, 259, 261, 136/262, 292
See application file for complete search history.

(56) References Cited

U.S. PATENT DOCUMENTS

| | | | | |
|---|---|---|---|---|
| 5,075,763 A | * | 12/1991 | Spitzer | H01L 29/452 136/256 |
| 5,389,159 A | * | 2/1995 | Kataoka | H01L 31/0392 136/251 |

(Continued)

FOREIGN PATENT DOCUMENTS

| | | |
|---|---|---|
| EP | 1 775 778 A2 | 4/2007 |
| WO | WO 2010/113708 A1 | 1/2012 |

*Primary Examiner* — Susan D Leong
(74) *Attorney, Agent, or Firm* — Muncy, Geissler, Olds & Lowe, P.C.

(57) ABSTRACT

A multi-junction solar cell having a Ge or GaAs substrate, as well as a solar cell structure having several subcells deposited on the substrate, the substrate having peripheral side faces, and the solar cell structure having a peripheral circumferential surface, which runs spaced apart from the side faces. To prevent oxidation and penetration of moisture, the circumferential surface of the solar cell structure is coated with a protective, electrically insulating first coating under essential exclusion of the upper surface facing the rays, or that without encroaching on the solar cell structure, the side faces of the substrate are coated with a protective, electrically insulating second coating or that both the side faces of the substrate as well as the circumferential surface of the solar cell structure are coated with a third coating by essential exclusion of the upper surface facing the rays.

13 Claims, 6 Drawing Sheets

(56) References Cited

U.S. PATENT DOCUMENTS

| | | | |
|---|---|---|---|
| 2003/0015728 A1* | 1/2003 | Bosco | H01L 27/142 257/184 |
| 2009/0159119 A1 | 6/2009 | Basol | |
| 2010/0018574 A1* | 1/2010 | Kwon | H01L 31/1804 136/252 |
| 2010/0059101 A1 | 3/2010 | Shinohara | |
| 2012/0015472 A1 | 1/2012 | Hayashi et al. | |

* cited by examiner

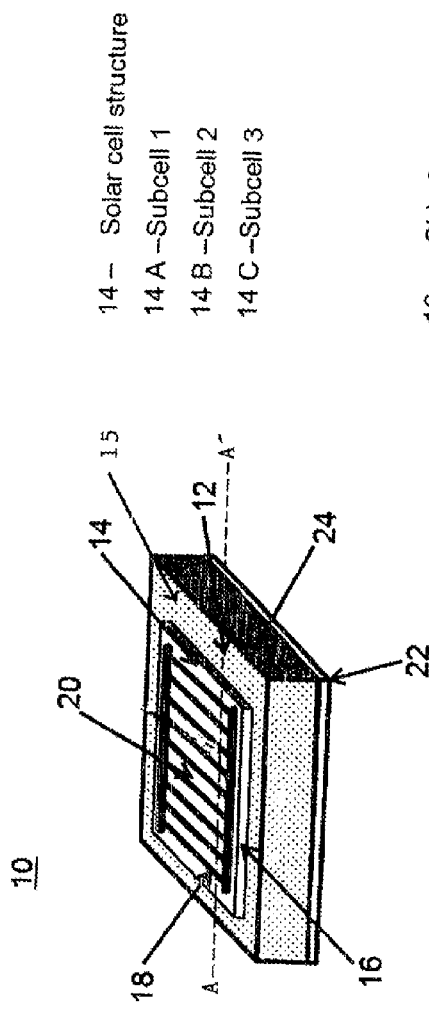
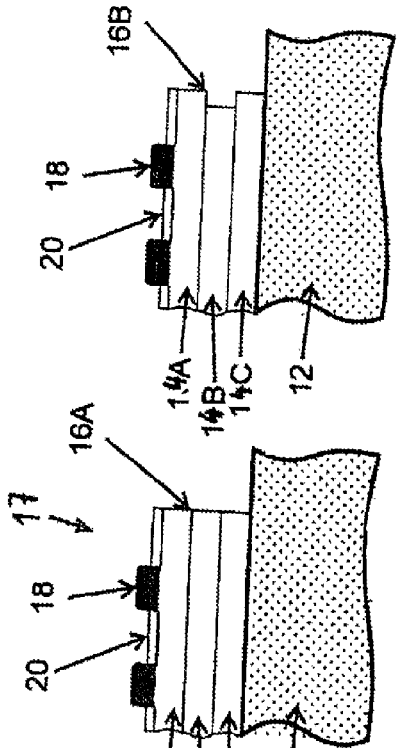
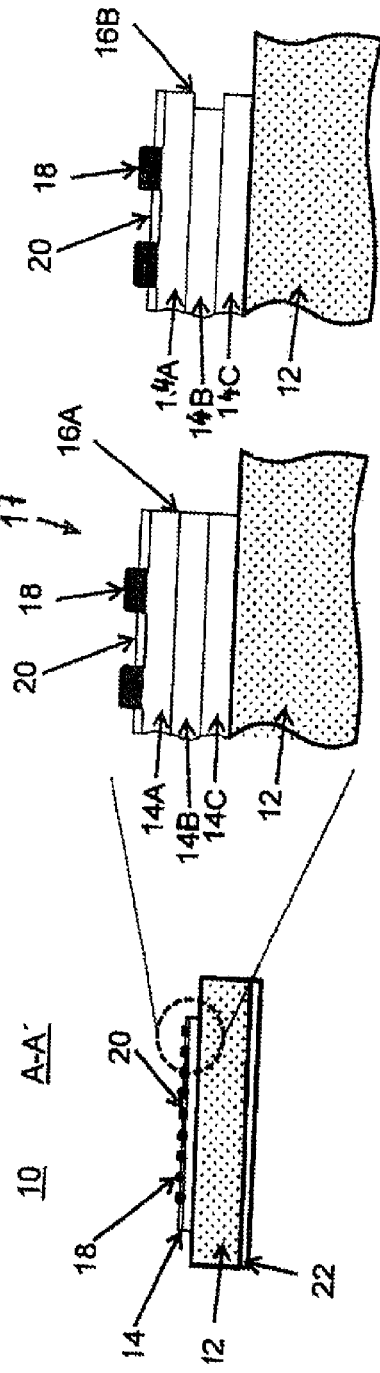
14 — Solar cell structure
14A — Subcell 1
14B — Subcell 2
14C — Subcell 3
16 — Side face
16A — Straight side face of the solar cell structure
16B — Side face of the solar cell structure where the subcell edges are offset laterally
Fig. 3
Fig. 3A
Fig. 3B
Fig. 3C

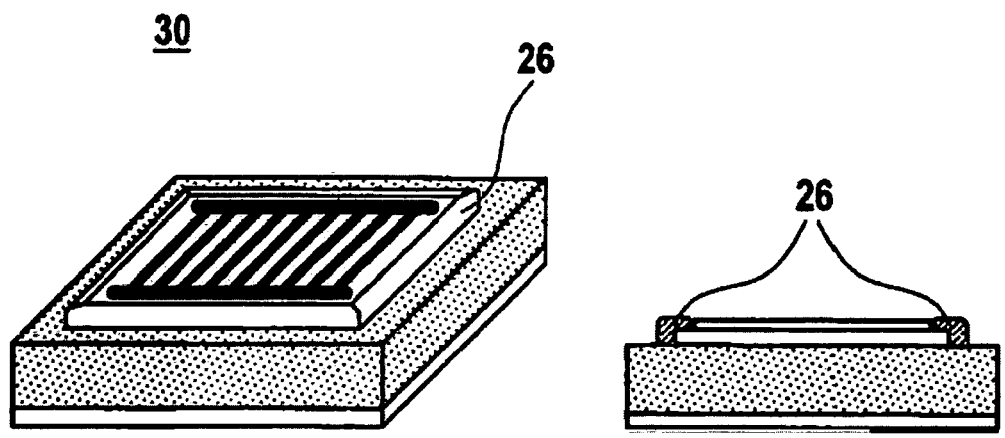
Fig. 4a　　　　　　Fig. 4b

MULTIPLE SOLAR CELL AND METHOD FOR MANUFACTURING THE SAME

This application is a continuation of Ser. No. 13/366,298, which was filed on Feb. 4, 2012, and which claims priority to Provisional application 61/439,449, which was filed on Feb. 4, 2011.

BACKGROUND OF THE INVENTION

1. Field of the Invention

The invention relates to a multi junction solar cell, comprising a substrate like a Ge or GaAs substrate as well as a solar cell structure comprising several subcells deposited on the substrate, wherein the substrate has peripheral side faces and the solar cell structure has a peripheral circumferential surface which runs spaced apart from the side faces.

2. Description of the Background Art

The invention also refers to a method for producing a multi junction solar cell, in particular a concentrator solar cell, wherein the solar cell structures with several subcells are deposited onto a substrate, such as a Ge or GaAs substrate, wherein an active solar cell area is defined as a solar cell structure by an etching, laser, or sawing process with subsequent overetching under formation of a circumferential surface and wherein the substrate is severed by sawing or lasing under formation of peripheral lateral faces into substrate sections for forming the individual multi junction solar cells.

Multi-junction solar cells are principally used in space travel and in terrestrial concentrator photovoltaic systems, CPV, which are increasingly gaining importance on the market for photovoltaics. Extended trouble-free service life is a pre-requirement for the cost-effectiveness of these systems and to gain further recognition. But on the other hand this will require overcoming a combination made up of widely varying environmental influences, such as moisture, temperature fluctuations, and UV light, which have a negative effect with respect to the reliability of individual components, submodules, and modules.

For the solar cell, as core component of a CPV module, the continuous loading with condensed moisture is critical among other things, because this can result in electrochemical corrosion of the substrate material of the cell and the cell structure and furthermore in failure of the solar cell. Since the front side of the solar cell is normally protected by application of a cover glass or an optical element, such as a lens or light diffuser, particularly the ridges of the substrate and the solar cell structure (mesa) will be affected on which photoactive areas of the solar cell are not protected.

FIG. 1 shows prior art which is practiced by some companies, wherein a solar cell is applied onto a conductive copper foil and is covered with a glass. The gap between the cover glass and the copper foil is provided with EVA (ethylene vinyl acetate) encapsulation of the solar cell in order to isolate the solar cell from the environment.

But this sealing technology is complex, however, and adds significant weight because of the cover glass.

A conventional CPV multi junction solar cell consists of a substrate, such as a Ge substrate or GaAs substrate, onto which the solar cell structure is deposited. In this context, the lowest cell of the multi junction solar cell can form itself directly in the substrate material during the deposition process. During the production of solar cells, the size of the active solar cell area (mesa) is defined by an etching or laser process, or a sawing process with subsequent overetching and an upper metallization and antireflective coating are deposited. Finally, the solar cell wafer is severed into individual cells by sawing or lasing.

The term "mesa" is generally known as an elevated area with a flat surface and a steep slope.

The produced CPV solar cells are normally bonded or soldered individually onto substrates, in Fresnel-based systems, for example, or with large surfaces, in dense array modules, for example. In the case of Fresnel optics modules, the substrates with the solar cells are assembled and interconnected on the back face of a module interior. In order to prevent pressure differences between the module interior and the environment, due to temperature and/or air pressure variations, for example, the modules are designed to be open or with a pressure compensation filter.

The filter can contain a membrane material that is impervious to water vapor, such as Gore-Tex, to largely prevent moisture from penetrating into the interior.

Alternatively, the back face of the module can be sealed with a large-surface transparent polymer layer after the complete assembly and interconnecting the substrate with the cells. Such embodiment according to the prior art is illustrated in FIG. 2.

As additional measure against penetration of the moisture into the module interior, the interior is flushed constantly with dry air or dry nitrogen in some systems.

A solar cell can be found in US-A-2009/0159119, the metallization on the front of which is covered by a moisture barrier layer, which can also extend along the side faces of the solar cell. Polyimide, silicon nitride or silicon oxide can be used as a material for the protective layer.

Integrated thin-film solar cells are the subject matter of US-A-2010/0018574.

A metallization which is suitable for high concentrator solar cells is described in U.S. Pat. No. 5,075,763.

SUMMARY OF THE INVENTION

The object of the present invention is to develop a multi junction solar cell as well as a method for producing a multi-junction solar cell of the type mentioned at the outset such that oxidation and penetration of moisture in multi-junction solar cells can be avoided.

The invention teaches that this problem is essentially solved in that the circumferential surface of the solar cell structure is coated with a protective electrically insulating first coating under essential exclusion of the upper surface facing the rays, or that without encroaching on the solar cell structure, the side faces of the substrate are coated with a protective, electrically insulating second coating or that both the side faces of the substrate as well as the circumferential surface of the solar cell structure is coated with a third coating under essential exclusion of the upper surface facing the rays.

The coating of the circumferential surfaces is preferably formed as a silicon oxide or silicon nitride coating, wherein the silicon oxide or silicon nitride coating is deposited on the circumferential surface, which can also be termed a mesa ridge or a mesa edge.

According to a further preferred embodiment, the silicon oxide and/or the silicon nitride coating has a thickness $d_s \leq 1 \mu m$, preferably a thickness $d_s$ in the range $100 nm \leq d_s \leq 500 nm$.

A further preferred embodiment distinguishes itself in that the peripheral side face of the substrate and the coating of the circumferential surface is designed as a polyimide coating, which consists of a polyimide or includes polyimides, wherein the polyimide coating is preferably applied by means of a brush or a dip process.

According to a further preferred embodiment, the polyimide coating has a thickness dp of less than 15 .mu.m, preferably 5 .mu.m.ltoreq.dp.ltoreq.10 .mu.m.

The invention moreover distinguishes itself in that the distance a between the circumferential surface of the solar cell structure and the side faces of the substrate is 10 .mu.m.ltoreq.a.ltoreq.100 .mu.m.

It can be provided optionally that the first coating and/or the third coating on the edge of the solar cell structure upper surface facing the rays extends across a width b with 5 .mu.m.ltoreq.b.ltoreq.50 .mu.m.

In terms of processing, the object is solved in that under essential exclusion of the upper surface, the circumferential surface of the solar cell structure facing the rays is coated with a protective, electrically insulating first coating or that the peripheral side faces of the substrate section is coated with a protective, electrically insulating second coating or that the circumferential surface and the peripheral side faces is coated with a third coating.

According to a preferred procedure, the coating of the circumferential surface of the solar cell structure is applied as silicon oxide, silicon nitride and/or a coating with dielectric materials.

In this context it is particularly provided that the deposition of the layer, i.e. in particular of the silicon oxide or silicon nitride layer, is performed prior to severing the substrate into the sections, so that the coating does not only extend along the circumferential surface of the solar cell structures but also along the upper surface of the substrate extending along the side of the solar cell structure. The severing into the individual sections is performed subsequently.

The invention furthermore distinguishes itself in that both the circumferential surface of the solar cell structure as well as the peripheral side face of the substrate section, which is also simply called substrate, is provided with a third coating, which particularly consists of or contains polyimide. This is applied by brush application, dip process, or screen resist methods. In this case, the third coating extends also along the upper surface of the substrate extending along the side of the solar cell structure, i.e. the substrate section.

Since the circumferential surface of the protective electrical insulating coating covering the solar structure essentially extends outside of the upper surface of the solar cell structure facing the rays, the coating could also be nontransparent without affecting the efficiency of the multi-junction solar cell negatively.

It should be noted, however, that due to production conditions, the edge region of the solar cell structure, i.e. of the upper surface facing the rays, is insignificantly covered by the coating material. The width of the respective edge is in a range between 5 .mu.m and 50 .mu.m.

It is furthermore provided that the circumferential surface and the side face are coated with the same coating material, and preferably in one operation.

The silicon oxide, silicon nitride and/or coating with dielectric materials is preferably applied in a thickness ds with ds.ltoreq.1 .mu.m, preferably a thickness in the range 100 nm.ltoreq.ds.ltoreq.500 nm and that the polyimide coating is applied in a thickness dp with dp.ltoreq.15 .mu.m, preferably in the range 5 .mu.m.ltoreq.dp.ltoreq.10 .mu.m.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIGS. 3, 3a, 3b, and 3c are perspective illustration of a multi-junction solar cell as well as sections of same, FIGS. 4a and 4b are perspective illustration of a multi junction solar cell as well as a cross-sectional view of the multi-junction solar cell with the circumferential surface of the solar cell structure coated.

DETAILED DESCRIPTION

Figure 1:
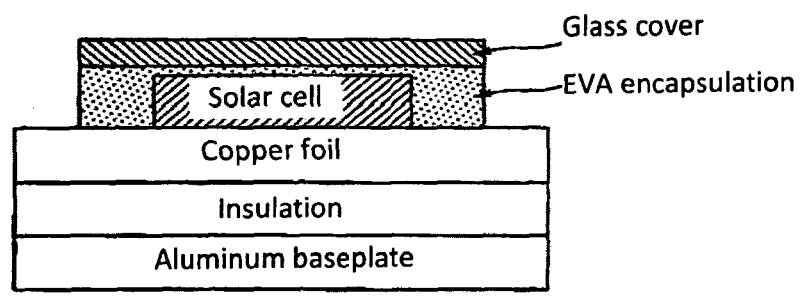
FIG. 1 is a schematic representation of an encapsulated solar cell according to prior art.
Figure 2:
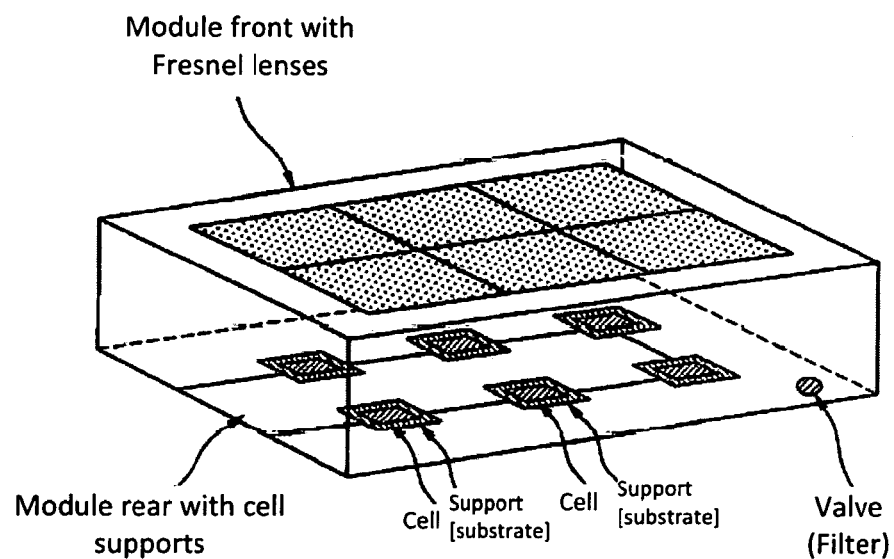
FIG. 2 is a solar cell module according to prior art.

FIG. 3 shows a structure of a conventional CPV multi-junction solar cell 10, comprising a substrate 12, such as a Ge or GaAs substrate, with a solar cell structure 14 deposited onto it, wherein a lowest cell of the multi junction solar cell can form directly in the substrate 12 during a deposition process.

During the production of CPV multi-junction solar cells 10, semi conductor layers are normally applied epitaxially onto a wafer forming the substrate. The wafer and/or substrate material normally involves a Ge or GeAs material. The deposited layers form subcells, wherein according to FIG. 3, this can include the solar cell structure of the subcells 14a, 14b, 14c. After the deposition of semiconductor materials, application of a front-side contact 18, particularly in form of a metallic lattice, as well as an anti-reflex coating 20 and a rear-side metallization 22 on the back of the substrate, if necessary, using etching, laser or sawing processes with subsequent overetching, active solar cell areas are produced which have a mesa structure with a circumferential surface 16. The substrate is then severed particularly by sawing into individual substrate sections 12, each of which have a peripheral side face 14.

As can be seen from the diagrammatic representation of FIG. 3, the active area, i.e. the solar cell structure 14 with the circumferential surface 16 runs spaced apart from the peripheral side face 24 of the substrate section 12, which hereinafter is simply termed substrate.

As can be seen from FIGS. 3b and 3c, the circumferential surface 16 can be flat (external surface 16) or the external surfaces of the subcells 14a, 14b, 14.c, extend offset on the edge, thus laterally offset (circumferential surface 16b). FIG. 3c just illustrates this in principle. The offset is created in that the different semiconductor materials of the subcells 14a, 14b, 14c have a dissimilar resistance to etching. This fact notwithstanding, the circumferential surface 16 and/or 16a, 16b runs on average opposite the peripheral side face 24 of the substrate 12 at a distance a with 10 .mu.m.ltoreq.a.ltoreq.100 .mu.m, however. The distance a is measured along the line A-A in FIG. 3, for example.

In order to avoid physical and chemical reactions of the solar cell material and/or the substrate material with the environment, which could result in electrical short circuits and/or corrosion or destruction of the cell structures, the invention provides that the circumferential surface 16 of the solar cell structure 14, i.e. the active solar cell range of each multi-junction cell 10 or the peripheral side faces 24 of the substrate 12 or both the circumferential surface 16 as well as the side faces 24 are provided with a protective electrically insulating coating, as is explained by means of the subsequent embodiments.

FIGS. 4a and 4b show an embodiment of a multi-junction solar cell 30, in which only the circumferential surface 16, i.e. a peripheral edge of the solar cell structure 14, is coated with a coating 26 in form of a silicon oxide or a silicon nitride layer. The silicon dioxide silicon nitride coating is preferably applied by deposition. This deposition is preferably performed before the substrate, onto which several active solar cell areas, i.e. solar cell structures 14, are deposited, is severed into the individual multiple junction solar cells. The silicon dioxide and/or silicon nitride coating does therefore not only extend along the circumferential surface 16 of each solar cell structure 14, but also along the top face 15 facing the rays and therefore the solar cell side of the substrate 12. The surface 17 of the solar cell structure 14 facing the rays and the multi junction solar cell therefore remains uncovered, except for an edge region, if necessary.

The deposition of the silicon oxide or silicon nitride layers is performed preferably from the gas phase by means of CVD processes.

Figures 5A, 5B:
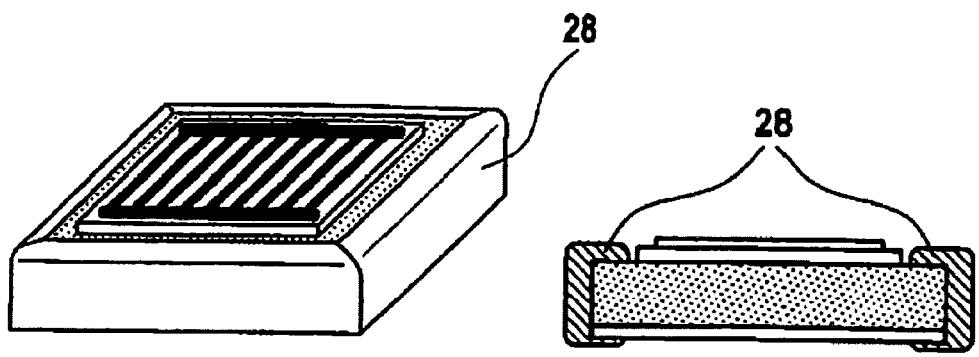
FIGS. 5a and 5b are perspective illustration of a multi junction solar cell as well as a cross-sectional view of the multi-junction solar cell with peripheral side faces of the substrate coated.

As an alternative, an embodiment of a multiple junction solar cell 32 is represented in FIGS. 5a, 5b, in which only the peripheral side faces 24 of the substrate 12 are provided with a coating 28 in form of a polyimide layer, for example, which consists of a polyimide or contains polyimides. The polyimide layer is applied by means of a brush or by means of screen resist methods in a dip process, that is, preferably separately for each multi junction solar cell.

Figures 6A, 6B:
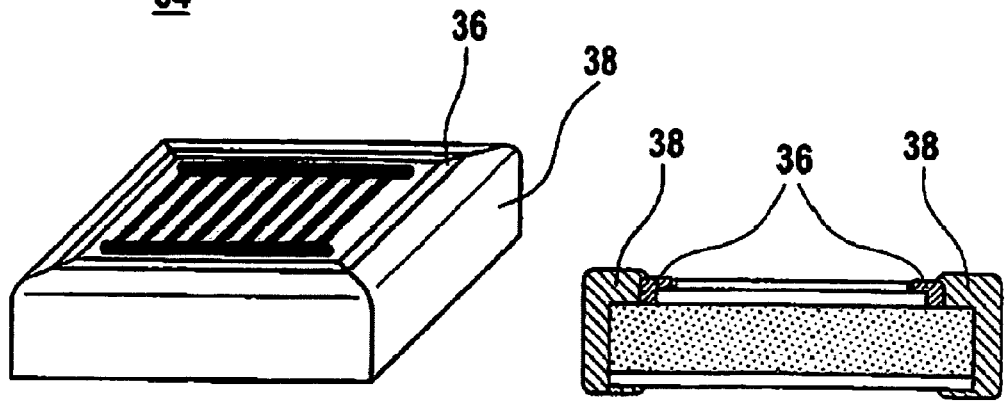
FIGS. 6a and 6b are perspective illustration of a multi junction solar cell as well as a cross-sectional illustration of the multi junction solar cell, in which both the circumferential surface of the solar cell structure as well as the side faces of the substrate are coated with different materials.

FIGS. 6a and 6b show a further embodiment of a multi junction solar cell 34, which is characterized in that the multi-junction solar cell 34 comprises both the coating of circumferential surfaces 36 of the solar cell structure 14 as well as the coating of side faces 38 of the substrate 12. Two different coating materials are used in the represented embodiment, namely silicon dioxide and/or silicon nitride for the coating of circumferential surfaces 36, and polyimide and/or polyimides for the coating of side faces 38. If the polyimide coating 36 also extends along the upper surface of the solar cell structure sides of the substrate 12 as shown in the drawing, then the area related to this is preferably covered with the silicon dioxide and/or silicon nitride layer, as discussed previously.

Figure 7A:
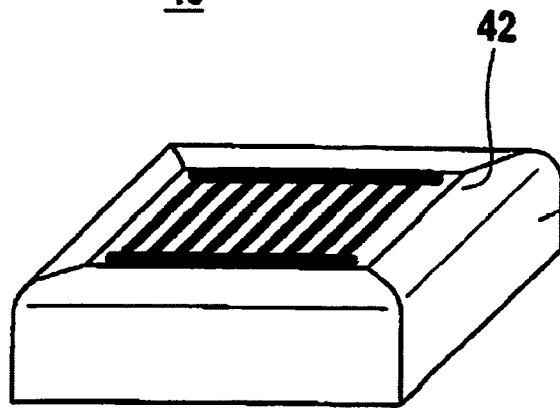
FIGS. 7a and 7b are perspective illustration of a multi junction solar cell as well as a cross-sectional illustration of the multi junction solar cell, wherein the circumferential surface of the solar cell structure and the side faces of the substrate is [sic] coated with the same material.
Figure 7B:
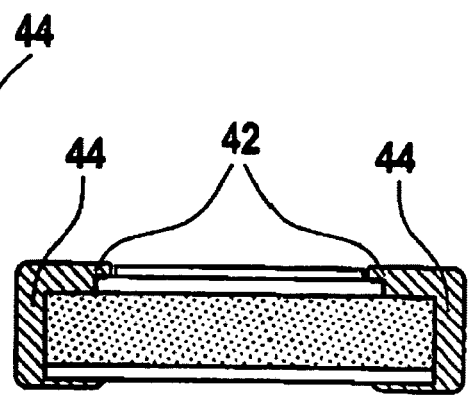

FIGS. 7a, 7b show a further embodiment of a multi junction solar cell 40, wherein a coating of the circumferential surfaces 42 of the solar cell structure 14 and/or the active solar cell area as well as a coating of the peripheral side faces 44 of the substrate 14 was performed with the same coating material. A polyimide and/or polyimides were used as coating material.

The thickness ds of the silicon oxide or silicon nitride coating 26, 36, is in the range ds.ltoreq.1 .mu.m, preferably 100 nm.ltoreq.ds.ltoreq.500 nm. The thickness dp of the polyimide coating 28, 38, 42, 44 is in the range dp.ltoreq.15 .mu.m, preferably 5 .mu.m.ltoreq.dp.ltoreq.10 .mu.m.

Further preferred dimensions are the following:
thickness of the substrate 12: 120 .mu.m to 170 .mu.m, preferably 150 .mu.m; thickness of the solar cell structure 14 above the upper surface of the substrate 12: 13 .mu.m to 17 .mu.m, preferably 15 .mu.m; length of the substrate 12: 0.9 cm to 1.1 cm, wherein the substrate has a square base area.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A multi-junction solar cell, comprising a substrate, and a solar cell structure comprising several subcells deposited on the substrate, wherein the substrate has peripheral side faces and a deposition surface, and the solar cell structure has a peripheral circumferential surface and an upper surface,
wherein the peripheral circumferential surface of the solar cell structure is coated with a protective, electrically insulating, first coating, the first coating essentially excluding the upper surface, wherein the side faces of the substrate are coated with a protective, electrically insulating, second coating, the second coating essentially excluding the deposition surface, and wherein vertical planes of the peripheral side faces of the substrate are not in a same plane as the peripheral circumferential surface.

2. A multi-junction solar cell, comprising:
a substrate, and
a solar cell structure comprising:
at least two subcells deposited on the substrate, the substrate having peripheral side faces and a deposition surface, and the solar cell structure having peripheral circumferential surfaces and an upper surface,
wherein vertical planes of the peripheral side faces of the substrate are not flush with the peripheral circumferential surfaces of the solar cell structure, and
wherein all the peripheral side faces of the substrate and the peripheral circumferential surfaces of the solar cell structure are coated with a coating,
and wherein the upper surface is essentially uncovered by the coating.

3. The multi-junction solar cell of claim 2, wherein only a first subcell of the at least two subcells is in direct contact with the substrate.

4. The multi-junction solar cell of claim 3, wherein a second subcell of the least two subcells is disposed substantially on the first subcell.

5. The multi-junction solar cell of claim 4, wherein the second subcell is disposed over a smaller area of the deposition surface than the first subcell.

6. The multi-junction solar cell of claim 1, wherein the vertical planes of the peripheral side faces are parallel to the peripheral circumferential surface of the substrate.

7. The multi-junction solar cell of claim 2, wherein the vertical planes of the peripheral side faces are parallel to the peripheral circumferential surface of the substrate.

8. The multi-junction solar cell of claim 2, wherein the coating covering the peripheral circumferential surfaces and peripheral side faces is continuous.

9. The multi-junction solar cell of claim 2, wherein the coating partially extends over a lower surface of the substrate opposite the deposition surface.

10. The multi-junction solar cell of claim 1, wherein the peripheral side faces of the substrate are perpendicular to the deposition surface, and wherein the circumferential surface is perpendicular to the upper surface of the solar cell structure.

11. The multi-junction solar cell of claim 2, wherein the peripheral side faces of the substrate are perpendicular to the deposition surface, and wherein the peripheral circumferential surfaces are perpendicular to the upper surface of the solar cell structure.

12. The multi-junction solar cell of claim 1, wherein the first coating is not disposed on the peripheral side faces of the substrate.

13. The multi-junction solar cell of claim 2, wherein the multi-junction solar cell is formed by cutting the substrate from a larger substrate, the larger substrate including at least two solar cell structures.

\* \* \* \* \*

UNITED STATES PATENT AND TRADEMARK OFFICE
CERTIFICATE OF CORRECTION

PATENT NO. : 9,437,767 B2
APPLICATION NO. : 14/689652
DATED : September 6, 2016
INVENTOR(S) : Gerhard Strobl It is certified that error appears in the above-identified patent and that said Letters Patent is hereby corrected as shown below:

TITLE PAGE

The Letters Patent shows:

(73) Assignee: Azur Space Solar Power GmbH, Hailbronn (DE)

It should show:

(73) Assignee: Azur Space Solar Power GmbH, Heilbronn (DE)

Signed and Sealed this
Twenty-fifth Day of October, 2016

Michelle K. Lee
*Director of the United States Patent and Trademark Office*